United States Patent [19]

Trommer

[11] Patent Number: 4,603,344
[45] Date of Patent: Jul. 29, 1986

[54] ROTATING RECTIFIER ASSEMBLY

[75] Inventor: William C. Trommer, Rockford, Ill.

[73] Assignee: Sundstrand Corporation, Rockford, Ill.

[21] Appl. No.: 635,511

[22] Filed: Jul. 30, 1984

[51] Int. Cl.[4] .................. H01L 23/32; H01L 23/46
[52] U.S. Cl. .......................... 357/76; 357/79;
357/82; 361/385; 361/396; 310/68 D; 165/80.4
[58] Field of Search ............ 165/80; 357/76, 79,
357/82; 361/385, 396, 386, 387; 310/68 D

[56] References Cited

U.S. PATENT DOCUMENTS

| | | | |
|---|---|---|---|
| 2,740,924 | 4/1956 | Brainard | 357/77 |
| 3,173,061 | 3/1965 | Storsand | 361/385 |
| 3,249,827 | 5/1966 | Benda et al. | 357/77 |
| 3,368,091 | 2/1968 | Layman | 310/68 R |
| 3,400,307 | 9/1968 | Baker et al. | 357/82 |
| 3,447,118 | 5/1969 | Ferree | 357/76 |
| 3,523,215 | 8/1970 | Steinmetz, Jr. et al. | 357/76 |
| 3,577,002 | 5/1971 | Hall | 290/46 |
| 3,602,793 | 8/1971 | Grozinger | 320/8 |
| 3,739,209 | 6/1973 | Drabik | 310/64 |
| 3,740,618 | 6/1973 | Vogel | 357/79 |
| 3,800,191 | 3/1974 | Newton | 357/76 |
| 3,838,303 | 9/1974 | Ernst | 310/68 D |
| 3,896,320 | 9/1980 | Moffatt | 310/52 |
| 3,927,338 | 12/1975 | Vieilleribiere | 310/68 D |
| 4,128,870 | 12/1978 | Knobloch et al. | 357/79 |
| 4,191,902 | 3/1980 | Yarrow | 310/68 D |
| 4,224,663 | 12/1980 | Maiese et al. | 361/388 |
| 4,289,989 | 9/1981 | Schibline | 310/261 |
| 4,329,603 | 5/1982 | Ballard | 310/61 |
| 4,338,652 | 6/1982 | Romanczuk et al. | 361/388 |
| 4,538,171 | 8/1985 | Stevens et al. | 357/79 |

FOREIGN PATENT DOCUMENTS 0123154 9/1980 Japan ..................... 357/76

Primary Examiner—James W. Davie
Assistant Examiner—Vangelis Economou
Attorney, Agent, or Firm—Wood, Dalton, Phillips, Mason & Rowe

[57] ABSTRACT

A rotatable rectifier assembly for use in a brushless generator. A housing 40 receives a stack of heat sinks 56–68 which are both thermally and electrically conductive and which sandwich diode wafers 78 making up a multiple phase, full wave rectifier. The requisite electrical connections are made by electrical connectors 102,110 slidably extending through the heat sinks and electrically connected to desired ones of the heat sinks and electrically isolated from other ones of the heat sinks.

11 Claims, 7 Drawing Figures

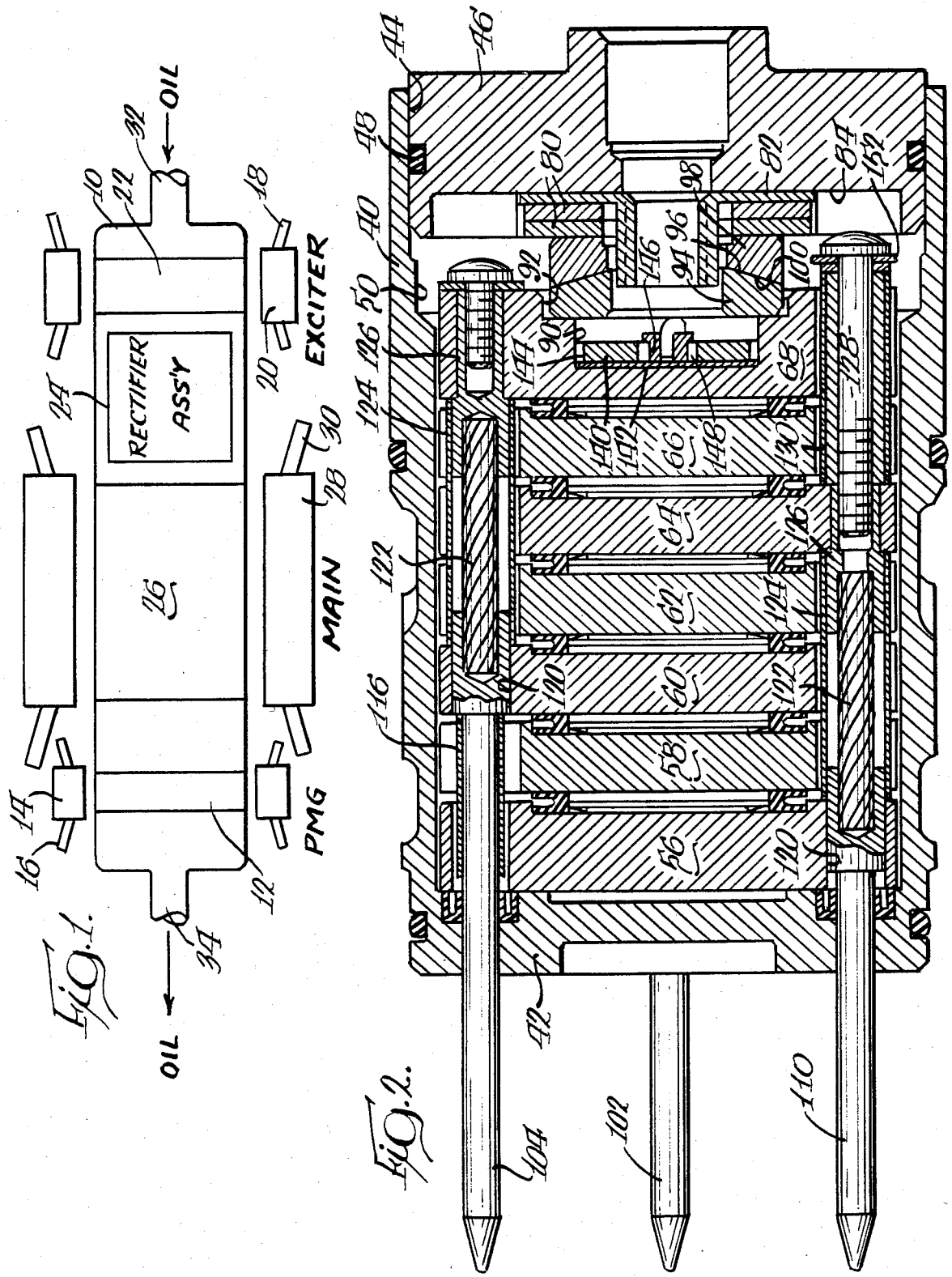

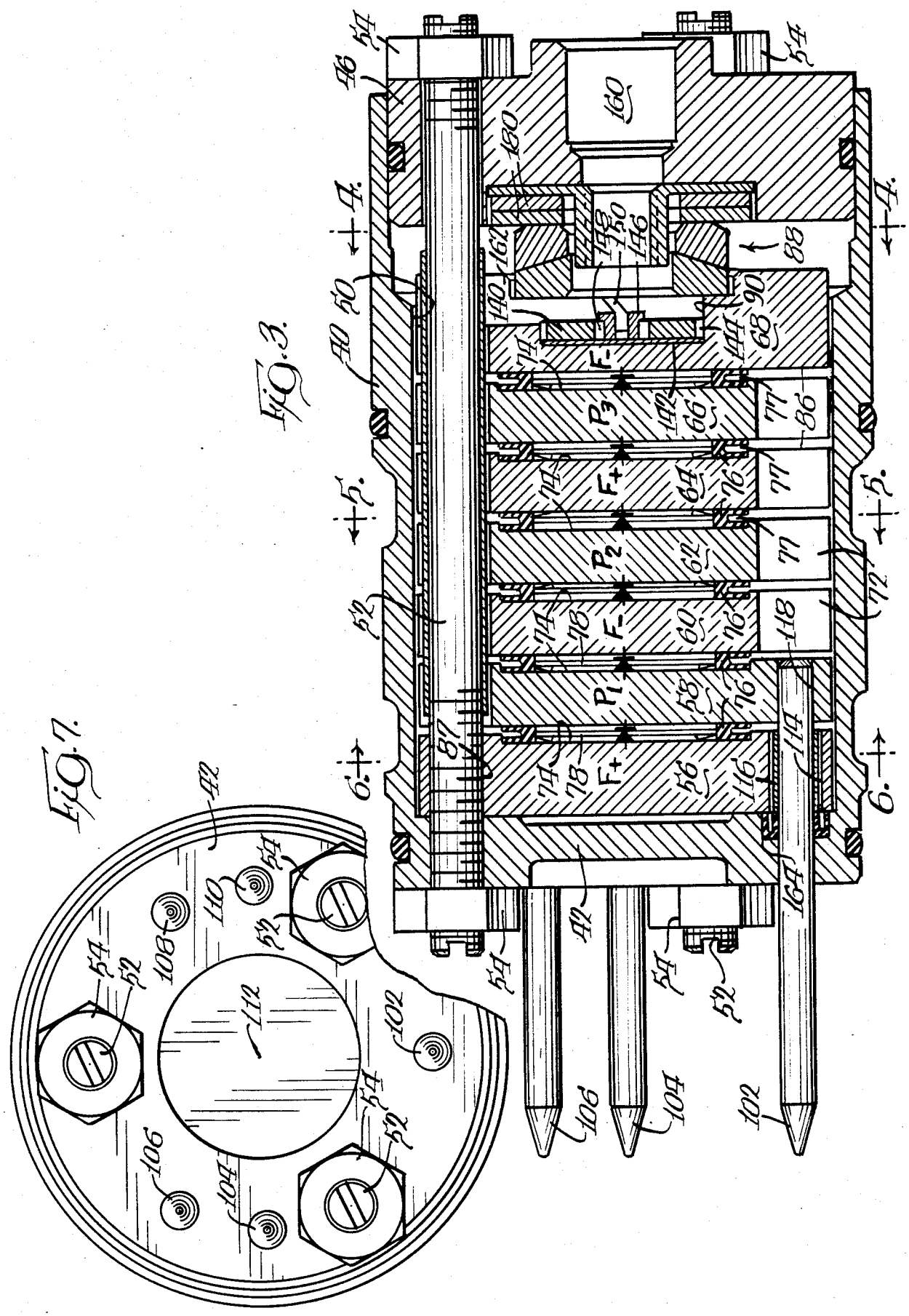

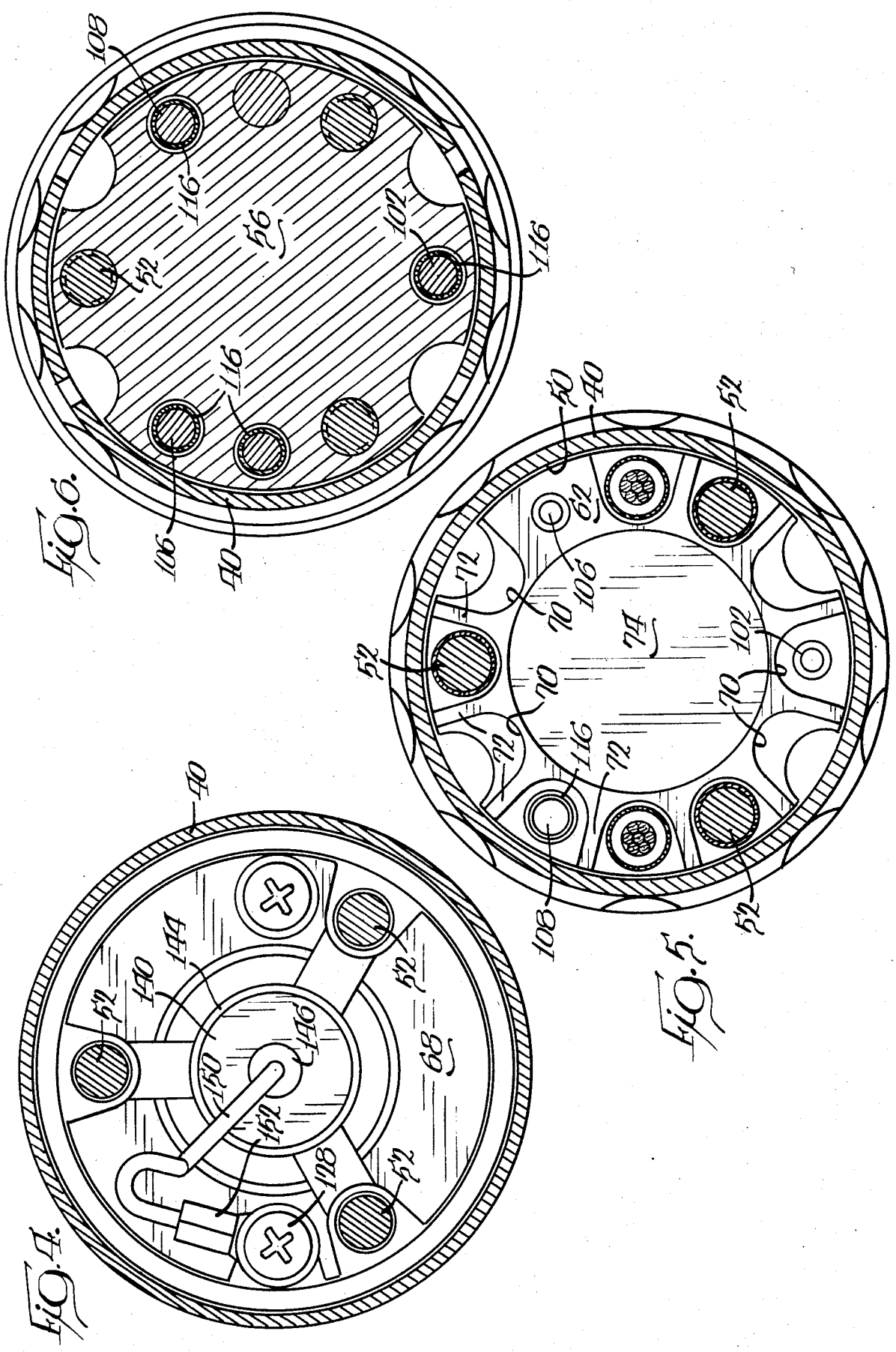

ROTATING RECTIFIER ASSEMBLY

FIELD OF THE INVENTION

This invention relates to a rectifier assembly, and more particularly, to a rectifier assembly that is adapted to be rotated at high speed for use in, for example, rectifying three phase alternating current generated by an exciter to provide direct current to establish the main magnetic field in a brushless generator.

BACKGROUND OF THE INVENTION

In many generating systems, particularly those that operate at high speeds, it is highly desirable to eliminate brushes since they frequently require maintenance or replacement and are perhaps the single weakest point in the system in terms of breakdowns and the like. Moreover, by their very nature, they may introduce transients into the electrical energy being outputed which in turn may interfere with the proper operation of some types of electrical loads being driven thereby.

A typical brushless generator has three distinct generating systems, including a main generator, an exciter and a permanent magnet generator. The permanent magnet generator includes permanent magnets for establishing a magnetic field which is employed to induce current in a set of windings. This induced current is in turn employed to generate a magnetic field in the exciter; and this magnetic field in turn is employed to induce an even higher level of current, typically three phase alternating, which is then employed to generate a magnetic field for the main generator.

In order to avoid the use of brushes, it is necessary that the magnetic field in the main generator be in the rotor so that the output of the system can be taken from the stator of the main generator. And in order to generate a suitable magnetic field in the rotor, it is necessary to utilize direct current, as opposed to alternating current, for the same. Since the output of the exciter is an alternating current, this current must be rectified to direct current. And again, in order to avoid resort to brushes, it is accordingly necessary that the rectifier interconnecting the exciter and the main generator field winding be carried by the rotor of the generator. U.S. Pat. No. 3,577,002 issued May 4, 1971 to Hall et al is generally illustrative of this approach although it does show a commutator and brush structure which is necessary for alternative use of the generating system as a starter motor.

Because the rectifier assembly is carried by the rotating shaft of the generating system, it is subjected to high centrifugal loading and much care must be taken to assure that the components of the rectifier are adequately supported against such forces. It will also be appreciated that it is highly desirable to minimize the space occupied by the rectifier assembly since it typically is housed within the shaft itself. Finally, it is desirable to make provision for cooling the rectifier assembly during operation since such not only minimizes the possibility of thermal damage to the components, but provides a greater capacity over a correspondingly sized, uncooled rectifier assembly.

It is also desirable that the assembly be such that it may be easily removed for servicing in the event of component failure.

The present invention is directed to the provision of a semiconductor assembly, typically a rectifier assembly, having the foregoing attributes.

Prior art of possible relevance includes the following U.S. Pat.: Nos. 3,400,307 issued Sept. 3, 1968 to Baker et al; 3,800,191 issued Mar. 26, 1974 to Newton; and 4,338,652 issued July 6, 1982 to Romanczuk et al.

SUMMARY OF THE INVENTION

It is the principal object of the invention to provide a new and improved semiconductor assembly. More specifically, it is an object of the invention to provide a new and improved semiconductor assembly, such as a rectifier, adapted for high speed rotation.

An exemplary embodiment of the invention achieves the foregoing objects in a semiconductor assembly including a generally tubular housing having an interior. A series of disk-like heat sink elements formed of thermally and electrically conductive material are disposed within the housing and in substantial abutment with the interior to form an aligned stack of the elements. At least one face of each of the elements includes a shallow recess and a semiconductor wafer of a thickness slightly greater than the depth of the recess is disposed within each of the recesses. A compressible annular insulator is located within each recess and extends about the periphery of the associated wafer to center the wafer in the associated recess. Means are provided for applying a compressive pressure to the stack to bring the elements and the wafers into good thermal and electrical contact and electrical conductors slidably extend through the stack and are in electrical contact with predetermined ones of the elements and electrically isolated from predetermined others of the elements.

In a preferred embodiment, the housing includes a coolant inlet and the annular insulators additionally serve as seals for sealing the associated wafer from the coolant received in the inlet. In a highly preferred embodiment, the seals are made self-energizing through the use of a radially outwardly opening peripheral groove in each seal which is exposed to coolant under pressure.

In the preferred embodiment, the semiconductors are diode wafers. The heat sink elements may be generally circular in shape and include cooling fins about their periphery.

The housing includes an opening through which the stack may be introduced along with a closure for the opening. The pressure applying means comprises a compressed spring interposed between the closure and endmost one of the heat sink elements in the stack. A pressure applying heat sink is interposed between the spring and the endmost heat sink element and a pressure distributing means is located between the spring and the pressure applying heat sink. Preferably, the pressure distributing means comprise mating spherical surfaces, one associated with the spring and the other associated with the pressure applying heat sink.

Where the assembly is intended for use in a rotating environment, the diodes and the pressure applying means are all centered on the rotational axis. If configured in the form of a full wave rectifier, there are five of the conductors pins and each lie generally parallel to the axis of the stack. Two of the conductors pins lie in a plane containing the axis and three of the conductors pins define and equilateral triangle centered on the axis.

3

Other objects and advantages will become apparent from the following specification taken in connection with the accompanying drawings.

BRIEF DESCRIPTION OF THE DRAWINGS

FIG. 1 is a somewhat schematic side elevation of a brushless generator with which the semiconductor assembly of the invention may be used;

FIG. 2 is a sectional view of the semiconductor assembly taken through the field conductor pins;

FIG. 3 is a sectional view similar to that of FIG. 2 but taken in a plane rotated from the plane in which FIG. 2 is taken and depicts a typical phase conductor pin and a typical tie bolt;

FIG. 4 is a sectional view taken approximately along the line 4—4 in FIG. 3;

FIG. 5 is a sectional view taken approximately along the line 5—5 in FIG. 3;

FIG. 6 is a sectional view taken approximately along the line 6—6 in FIG. 3; and FIG. 7 is an end view of the assembly.

DESCRIPTION OF THE PREFERRED EMBODIMENT

In its best mode, a semiconductor assembly made according to the invention is intended for use as a rotating rectifier assembly to be contained in a brushless generator such as seen in FIG. 1. The brushless generator includes an elongated shaft 10 journalled by any suitable means and bears a series of permanent magnets 12 thereon. A stator 14 provided with windings 16 surrounds the magnets 12 and defines a permanent magnet generator therewith. Electrical current generated in the winding 16 during rotation of the shaft 10 is provided via suitable conductors to windings 18 in an exciter stator 20. Axially aligned with the exciter stator 20 and carried by the shaft 10 are windings 22 in which current will be induced during rotation of the shaft.

The current induced in the windings 22 is fed to a rectifier assembly 24 contained within the shaft 10 where it is rectified to direct current, usually from three phase alternating current. Direct current from the rectifier 24 is then fed to a main field winding 26 carried by the shaft 10 and rotatable in alignment with a main generator stator 28. The stator 28 includes windings 30 in which an alternating current is induced and which, by suitable conductors not shown, may be connected to suitable loads.

To maximize the capacity of the machine, the shaft is provided with an oil inlet 32 and an oil outlet 34 at its opposite ends. Oil introduced into the shaft is typically used for cooling the windings 22 and 26 as well as the rectifier assembly 24 and may be used for lubrication purposes in connection with bearings (not shown).

Turning now to the details of the rectifier assembly 24, with reference to FIGS. 2 and 3, the same is seen to include a can-like housing 40 having a generally cylindrical shape and being closed at one end 42. The opposite end includes an opening 44 in which a closure 46 may be disposed. The housing 40 and the closure 46 are both made of insulating material. The closure includes a radially outwardly opening groove and seal construction 48 whereby the same may be sealed to the interior 50 of the housing 40. As best seen in FIGS. 3 and 7, tie bolts 52 extend through the housing 40 and the closure 46 at equally angularly spaced locations to receive nuts 54 to assemble the rectifier assembly 24 to the housing 40.

Contained within the interior 50 are a series of electrical and thermally conductive, disk-like heat sinks 56, 58, 60, 62, 64, 66 and 68. The heat sinks 56–66 inclusive serve both as heat sinks and as electrical connectors. The heat sink 68 serves the same two functions and a pressure applying function in addition as will be seen. As can be seen in FIG. 5, which shows the heat sink 62, which in turn is representative of the heat sinks 58–66, inclusive, the periphery is closely adjacent to the interior 50 of the housing 40. The same is true of the heat sinks 56 and 68. Thus, the interior 50 of the housing 40 serves to form the heat sinks 56–68 into an aligned stack.

As can also be seen in FIG. 5, the heat sinks 58–66 are provided with a series of radially outwardly opening cut-outs 70 separated by radially directed fingers or fins 72 to enhance heat transfer to a liquid coolant, such as oil, flowed through the interior 50 of the housing 40.

As seen in FIGS. 2 and 3, each of the heat sinks 56–66 inclusive has a face provided with a shallow recess 74 which, as seen in FIG. 5 is circular in configuration. An annular seal 76 is disposed in each such recess 74. The seals 76 are, of course, compressible and are made of insulating material, and have thicknesses greater than the depth of the recesses 74. Each is provided with a radially outwardly opening, peripheral groove 77 which contains an annular shaped beam spring (not shown), for purposes to be seen.

Disposed within each recess 74 and surrounded by the associated seal 76 is a diode wafer 78, that is, a conventional semiconductor diode without the customary packaging provided by the manufacturer. When the assembly is to be used as a rectifier for three phase alternating current, the diode wafers 78 are disposed in their associated recesses 74 with the polarity illustrated in FIG. 3. The diode wafers 78 have a thickness slightly greater than the depth of the recesses 74, and are essentially equal in thickness to that of the annular seal 76. Sandwiched between each conductive surface of the diode wafer 78 and the mating surfaces on the conductor plates is a conductive metallic preform (not shown) which enhances electrical and thermal conductivity.

The recesses 74 are centered on the rotational axis of the assembly and the seals 76 serve to center the diode wafers 78 within the recesses 74 so that they likewise lie on such axis. It will, of course, be appreciated that this arrangement not only provides for balance about the rotational axis, but locates the diodes 78 radially inwardly as nearly as is possible to minimize centrifugal loading thereon during operation.

To assure good electrical and thermal conductivity the stack of heat sinks 56–58 and interposed diode wafers 78 are compressed. In accomplishing such compression, it is desirable to avoid loading the housing 40. Thus, the stack of heat sinks 56–68 is compressed between the heat sink 56 and the closure 46 by spring means in the form of Belleville washers 80 acting against a thrust washer 82 received in a recess 84 on the interior side of the closure 46. The force provided by the compressed Belleville washers 80 is applied to the heat sink 68. As a consequence, the heat sinks 58–68, and interposed diode wafers 78, similarly have a force applied thereto since the heat sinks 58–68 are slidably received on the tie bolts 52. The diode wafers 78 are thus compressed between the two adjacent heat sinks. Because the diode wafers 78 have a thickness greater than the depth of the recesses 74 such compression will not urge the heat sinks into engagement with each other. Rather, some small spaces 86 exist which electrically isolate each heat sink from the adjacent heat sinks. The desirable avoidance of loading the housing 40 with the compressive force provided by the Belleville washers 80 is achieved by threading the heat sink 56 as at 87 to threadably receive the ends of the tie bolts 52. Thus the clamping force extends only between the heat sink 56 and the closure 46 and is not transmitted to the housing 40.

To assure that the compressive force is made along the axis of rotation so that one edge of a given diode wafer 78 is not subjected to a greater compressive force at an opposite edge, a pressure distributing means, generally designated 88, is disposed between the Belleville washers 80 and the pressure applying heat sink 68.

More specifically, a face of the pressure applying heat sink 68 directed toward the closure 46 is provided with a stepped recess 90. The widest portion 92 of the recess receives a first washer-like element 94 having a spherical surface 96 whose center lies on the rotational axis of the device. A second washer-like structure 98 having a mating spherical surface 100 is interposed between the washer-like structure 94 and the Belleville washers 80. As a consequence of the spherical surface interface thus defined, all force from the Belleville washers 80 applied to the pressure applying heat sink 68 will be directly along the axis of rotation of the device to provide for uniform pressurization of all parts of each diode wafer 78. The degree of compressive force applied is, of course, varied by the degree of stressing of the Belleville washers 80; and this in turn is controllable by the degree of draw down of the nuts 54 on the tie bolts 52 at the closure end 46 of the assembly.

External electrical connections can be made either by pins 102, 104, 106, 108, or 110 as illustrated or, in lieu of the pins, by conventional terminals (not shown) as desired. Regardless, electrical conductors must exit the housing 40 and in the illustrated embodiment, the same is accomplished through the end 42. For balance purposes, it is preferable that two of the pins 104 and 110 lie in a plane also including the rotational axis, shown at 112 of the assembly and be equidistant therefrom. Three pins 102, 106 and 108 lie on the apexes of an equilateral triangle which in turn has its center on the axis 112. This configuration is, of course, for a three phase full wave rectifier as is typically used in a brushless generator. In such a case, the pins 104 and 110 may conventionally serve as connections to the main generator field winding to provide rectified, direct current thereto. Each of the pins 102, 106 and 108 may serve as inputs to the rectifier assembly, each receiving one phase of a three phase alternating current source.

For such a configuration, the heat sinks 56 and 64 will be connected to one side of the field winding as, for example, the positive side as indicated in FIG. 3. The heat sinks 60 and 68 will be connected to the negative side of the field winding. The heat sink 58 will be connected to the first alternating current input phase; the heat sink 62 connected to the second alternating current input phase; and the heat sink 66 connected to the third alternating current input phase.

Thus, as seen in FIG. 3, the pin 102 extends through a bore 114 in the heat sink 56 which is lined with an insulating sleeve 116 to be tightly received in a bore 118 in the heat sink 58. The pin 106 is similarly connected to the heat sink 62, passing through bores provided with insulating sleeves in the heat sinks 56, 58 and 60. The pin 108 will likewise be connected to the heat sink 66.

It will thus be observed that except for the rigid connection to the designated heat sink, the electrical conductors extend generally parallel to the rotational axis of the assembly and slidably through all of the various components. It will be observed that in some instances, bores may not be employed. Rather, pins may extend through the cut-outs 70 in the heat sinks 58–66 as seen in FIG. 5.

Turning now to FIG. 2, the pin 104 extends through an insulating sleeve 116 to be tightly received in a bore 120 in the heat sink 60 to make electrical connection therewith. A braided wire 122 extends from the pin 116 through an insulating sleeve 124 to a stud 126 electrically connected to the heat sink 68. Thus, the heat sink 60 and the heat sink 68 are electrically connected together to provide the negative field lead as mentioned previously. The braided wire 122 allows relative axial movement between the heat sinks 60 and 68 to occur.

The pin 110 is similarly electrically connected to the heat sink 56 and to the heat sink 64 to establish the positive field lead. It will be observed that in addition, a terminal screw 128 extends from the righthand edge of the heat sink 68 through an insulator sleeve 130 to be threaded into the stud 126 associated with the pin 110. As is well known, many generators of the type in which the present invention is intended to be employed provide a so-called load resistor across the leads to the main field winding for the purpose of dissipating voltage spikes generated during the change of the conductive states of the diodes employed in the rectifier. In the present invention, a donut shaped load resistor 140 is disposed in the bottom of the stepped recess 90 within the pressure applying heat sink 68. The base of the load resistor 40 is electrically isolated from the heat sink 68 by a layer 142 of insulating material but has its outer periphery in electrical contact with the heat sink 68 by means of a peripheral silver solder connection 144.

A connector pin 146 is disposed in the center of the load resistor 140 and is electrically connected thereto by silver solder 148. The connector pin 146 is provided with a flexible electrical lead 150 which, as seen in FIG. 4, extends to a terminal 152 impalled by the screw 128. Thus, within the confines of the rectifier assembly itself, the load resistor 140 is connected across the rectifier output.

The rectifier assembly is completed by the provision of the coolant inlet 160 in the closure 46 which allows coolant such as oil to be directed to the stepped recess 90 in the heat sink 68. As seen in FIG. 3, one side of the recess 90 opens as at 162 to the interior of the housing 40. Thus, the oil may flow radially out of the recess 90 through radial grooves on the recess end of the conductor plate 68 and through the very narrow spacing between thr peripheries of the heat sinks and the interior 50 as well as between the fins 72 to a suitable outlet not shown. Such oil will absorb and carry away heat from the heat sinks with heat transfer being enhanced through use of the fins 72.

To avoid leakage, the exit points of the pins 102–110 are provided with annular seals 164 which are U-shaped in cross section.

It will be observed that the open groove in the seals 164 as well as the grooves 77 in the seals 76 open to spaces in which the coolant may be received. Since the coolant will be under some pressure, it will be appreciated that the pressure will act against opposite sides of the grooves in each of the seals 164 and 76 tending to spread them apart to thereby provide enhanced sealing.

Consequently, leakage from the housing is avoided and the diode wafers 78 are not contacted by coolant.

From the foregoing, it will be appreciated that a rectifier assembly made according to the invention is extremely compact radially and is significantly more axially compact than would be the case if packaged diodes, as opposed to diode wafers, were employed. It will also be appreciated that the location of the diodes minimizes loading thereon due to centrifugal force during operation of a generator incorporating such an assembly and that, through the use of cooling, high operational efficiency may be achieved.

I claim:

1. A rectifier assembly adapted to be mounted in a generator rotor for rotation therewith comprising:
   a generally tubular housing;
   a stack of disc-like heat sink elements formed of thermally and electrically conductive material within said housing;
   at least one face of each said elements including a shallow recess;
   an annular seal of insulating material disposed in each said recess serving to seal the recess and electrically isolate adjacent ones of said elements;
   a diode wafer within each said annular seal and associated recess;
   means for applying a compressive pressure to said stack to bring said elements and said wafers into good thermal and electrical contact;
   electrical conductors slidably extending through said stack and in electrical contact with predetermined ones of said elements and electrically isolated from predetermined others of said elements; and
   means for introducing a coolant into said housing.

2. The rectifier assembly of claim 1 wherein said elements are generally circular in shape and include cooling fins about their periphery in close adjacency to said housing.

3. The rectifier assembly of claim 1 wherein said housing is can-like and includes an opening through which said stack may be introduced; a closure for said opening; said applying means comprising a compressed spring means interposed between said closure and an endmost one of said elements in said stack, a pressure applying heat sink interposed between said spring means and said endmost
   element and pressure distributing means between said spring means and said pressure applying heat sink.

4. The rectifier assembly of claim 3 wherein said pressure applying heat sink is disc-like and includes a central stepped recess opening toward said closure and said pressure distributing means comprises a first spherical surface associated with the step of said recess and a second, mating spherical surface associated with said spring means; and a load resistor within said stepped recess.

5. The rectifier assembly of claim 1 wherein there are five of said conductors, each generally parallel to the axis of said stack, two of said conductors lying in a plane containing said axis and three of said conductors defining an equilateral triangle centered on said axis.

6. A semiconductor assembly comprising:
   a generally tubular housing having an interior;
   a series of disc-like heat sink elements formed of thermally and electrically conductive material within said housing in substantial abutment with said interior to form an aligned stack of said elements;
   at least one face of each said elements including a shallow recess;
   a semiconductor wafer of a thickness slightly greater than the depth of a recess within each said recess;
   a compressible annular insulator within each said recess and extending about the periphery of the associated wafer to center the wafer in the associated recess;
   means for applying a compressive pressure to said stack to bring said elements and said wafers into good thermal and electrical contact; and
   electrical conductors slidably extending through said stack and in electrical contact with predetermined ones of said elements and electrically isolated from predetermined others of said elements.

7. The semiconductor of claim 6 wherein said housing includes a coolant inlet and said annular insulators additionally serve as seals for sealing the associated wafer from coolant received in said inlet.

8. The semiconductor of claim 6 wherein each of said annular insulators has a radially outwardly opening peripheral groove exposed to coolant entering said inlet.

9. A rectifier assembly adapted to be mounted in a generator rotor for rotation therewith comprising:
   a generally tubular housing having an interior;
   a series of disc-like heat sink elements formed of thermally and electrically conductive material within said housing and in substantial abutment with said interior to form an aligned stack of said elements;
   at least one face of each said elements including a shallow recess;
   an annular seal of insulating material disposed in each said recess serving to seal the recess and electrically isolate adjacent ones of said elements;
   a diode wafer of a thickness slightly greater than the depth of a recess located within each said annular seal and positioned thereby in the associated recess;
   means for applying a compressive pressure to said stack to bring said elements and said wafers into good thermal and electrical contact;
   electrical conductors slidably extending through said stack and out of said housing interior to exit said housing and in electrical contact with predetermined ones of said elements and electrically isolated from predetermined others of said elements;
   means for introducing a coolant into said housing; and
   additional seals sealing said conductor to said housing at their point of exit from said housing.

10. The rectifier assembly of claim 9 wherein said housing is can-like and includes an opening through which said stack may be introduced; a closure for said opening; said applying means comprising a compressed spring means interposed between said closure and an endmost one of said elements in said stack, a pressure applying heat sink interposed between said spring means and said endmost
    element and pressure distributing means between said spring means and said pressure applying heat sink.

11. The rectifier assembly of claim 10 wherein said pressure applying heat sink is disc-like and includes a central stepped recess opening toward said closure and said pressure distributing means comprises a first spherical surface associated with the step of said recess and a second, mating spherical surface associated with said spring means; and a load resistor within said stepped recess.

* * * * *